United States Patent
Kang et al.

(10) Patent No.: US 7,071,744 B2
(45) Date of Patent: Jul. 4, 2006

(54) APPARATUS AND METHOD FOR DETECTING A PHASE DIFFERENCE

(75) Inventors: Han-Chang Kang, Taipei Hsien (TW); Chao-Cheng Lee, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 10/905,053

(22) Filed: Dec. 13, 2004

(65) Prior Publication Data

US 2005/0134322 A1   Jun. 23, 2005

(30) Foreign Application Priority Data

Dec. 18, 2003  (TW) ................ 92135941 A

(51) Int. Cl.
*H03L 7/06* (2006.01)
(52) U.S. Cl. ................. 327/157; 327/156; 327/2
(58) Field of Classification Search ........ 327/156–158, 327/2, 3, 147–148
See application file for complete search history.

(56) References Cited

U.S. PATENT DOCUMENTS

| | | | |
|---|---|---|---|
| 5,592,120 A * | 1/1997 | Palmer et al. ............. | 327/536 |
| 5,603,109 A * | 2/1997 | Feeney ..................... | 455/192.2 |
| 6,531,913 B1 * | 3/2003 | Ross ........................ | 327/536 |
| 6,819,723 B1 * | 11/2004 | Wu et al. ................... | 375/324 |
| 6,894,546 B1 * | 5/2005 | Mika et al. ................ | 327/157 |

OTHER PUBLICATIONS

Gabriel Brenna, et al., A 2GHz Direct-Conversion WCDMA Modulator in 0.25um CMOS, 2002 IEEE International Solid-State Circuits Conference.

Behzad Razavi, Design Considerations for Direct-Conversion Receivers, IEEE Transactions on Circuits and Systems-II: Analog and Digital Signal Processing, vol. 44 No. 6, Jun. 1997.

* cited by examiner

*Primary Examiner*—Dinh T. Le
(74) *Attorney, Agent, or Firm*—Winston Hsu

(57) ABSTRACT

A method for detecting a phase difference between a first input signal and a second input signal is provided. The method contains: detecting the phase difference of the first and the second input signals to produce an output signal; generating a first voltage according to a first level of the output signal; generating a second voltage according to a second level of the output signal; and comparing the first voltage and the second voltage to produce the information regarding the phase difference between the first and the second input signals.

20 Claims, 5 Drawing Sheets

APPARATUS AND METHOD FOR DETECTING A PHASE DIFFERENCE

BACKGROUND OF INVENTION

1. Field of the Invention

The present invention relates to an apparatus for detecting a phase difference, and more specifically, to an apparatus for detecting a phase difference using a charge pump module and a method thereof.

2. Description of the Prior Art

Many types of circuits, such as clock generators or RF transceivers, require a clock signal with highly precise phase. An imprecise phase of the clock signal will result in the mistake of the whole system. Generally speaking, the larger the phase error, the larger the jitter of output clock signal(s). Hence, for the systems which need precise clock signals, the larger phase error may result in a serious error in circuits of the next stages.

Phase differences in circuits can be adjusted when the phase differences can be detected. However, in some cases, the phase difference is so minute that the conventional phase detector cannot detect the phase difference between the two input signals.

SUMMARY OF INVENTION

It is therefore one of objectives of the claimed invention to provide an apparatus and a method for detecting a phase difference between two input signals when the phase difference is minute.

The other objective of the claimed invention is to provide an apparatus and a method for detecting a phase difference by using a charge pump module.

The other objective of the claimed invention is to provide an apparatus and a method for detecting a phase difference and accumulating the phase difference.

According to the claimed invention, a method for detecting a phase difference between a first input signal and a second input signal is disclosed. The method contains: receiving the first and the second input signals and producing an output signal; generating a first voltage and a second voltage according to the level of the output signal, respectively; and comparing the first voltage and the second voltage to produce information regarding the phase difference between the first and the second input signals.

According to the claimed invention, an apparatus for detecting a phase difference between a first input signal and a second input signal is disclosed. The apparatus for detecting a phase difference contains a detecting circuit utilized for detecting the first and the second input signals and producing an output signal; a charge pump module utilized for generating a first voltage and a second voltage according to the level of the output signal; and a comparing circuit utilized for comparing the first voltage and the second voltage to produce information regarding the phase difference between the first and the second input signals.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
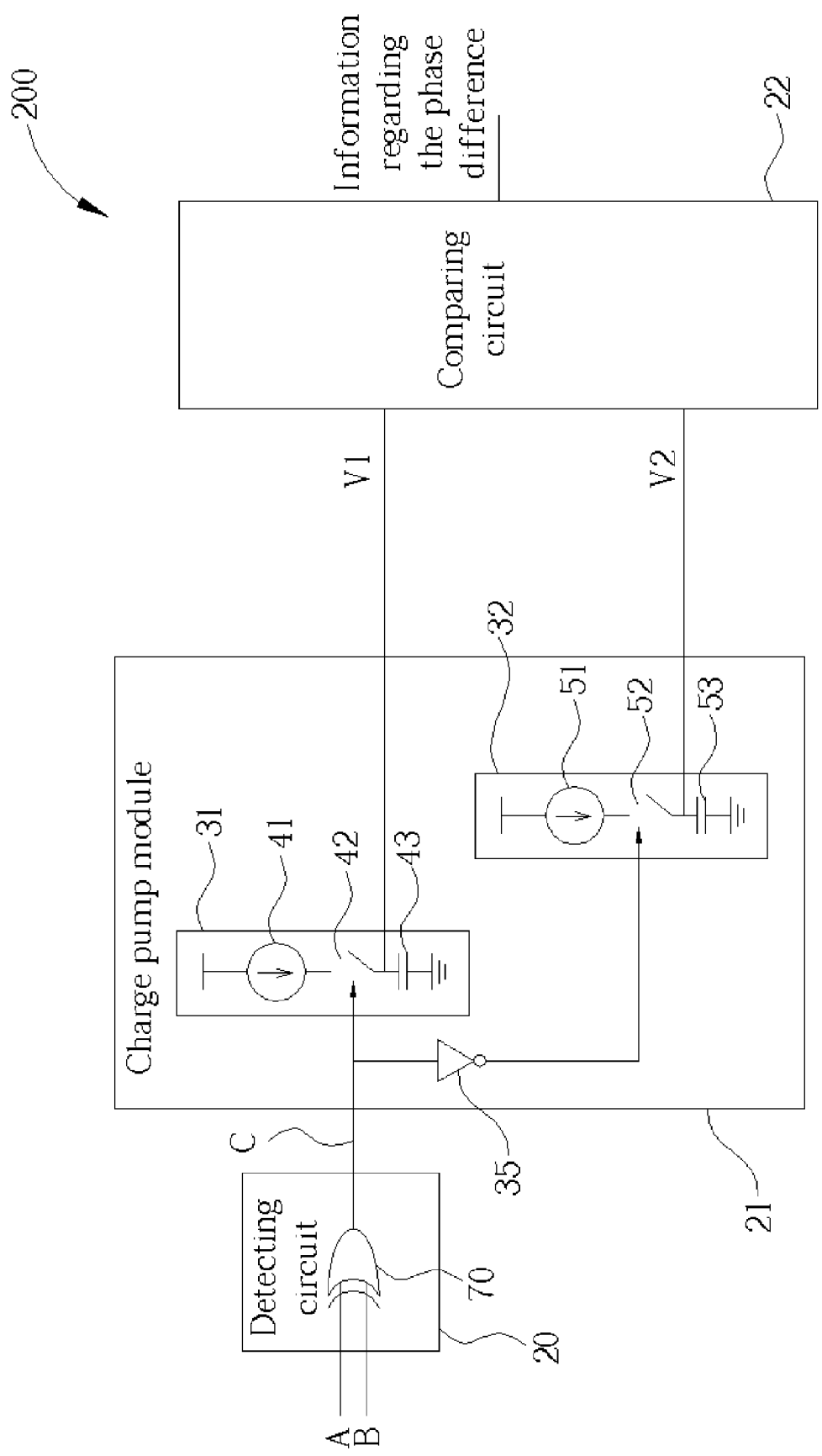
FIG. 1 is a functional diagram of an apparatus for detecting a phase difference according to one embodiment of the claimed invention.

An example of the disclosed method and structure of the claimed invention is given in FIG. 1. FIG. 1 is a functional diagram of an apparatus for detecting a phase difference according to the claimed invention. The apparatus 200 comprises a detecting circuit 20, a charge pump module 21, and a comparing circuit 22. In the embodiment of the claimed invention, the input ends of the detecting circuit 20 receive a first input signal A and a second input signal B. The detecting circuit 20 detects a phase difference between the first input signal A and the second input signal B and produces an output signal C. In an embodiment, the detecting circuit 20 is implemented using a XOR gate 70. It should be appreciated the detecting circuit 20 of the present invention can be any type of phase detectors and is nor limited to being a XOR gate.

Figure 2:
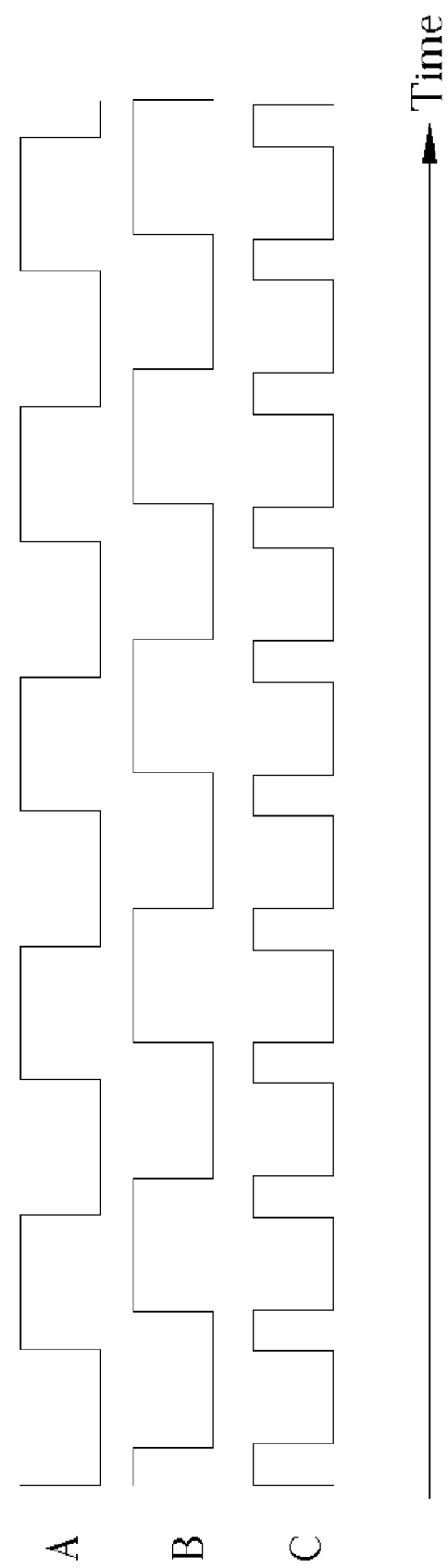
FIG. 2 is timing diagram of the first input signal A, the second input signal B, and the output signal C.

Please refer to FIG. 2. FIG. 2 is a timing diagram of the first input signal A, the second input signal B, and the output signal C. The first input signal A and the second input signal B in FIG. 2 are two input signals having the same frequency but different phases. Of course, the first input signal A and the second input signal B can be two input signals having the different frequency. The output signal C represents the phase difference between the first input signal A and the second input signal B. In this instance (FIG. 2), since the phase difference between the first input signal A and the second input signal B is smaller than 90 degrees, the duty cycle of the output signal C is smaller than 50%. If the phase difference between the first input signal A and the second input signal B is exactly 90 degrees, the duty cycle of the output signal C will be exactly 50%. The above-mentioned description is only one embodiment and is not to limit the present invention. The apparatus and the method according to the claimed invention can, of course, be utilized to detect the phase difference between two input signals with different frequencies.

In an embodiment, the charge pump module 21 in FIG. 1 comprises a first charge pump 31, a second charge pump 32, and an inverter 35. The first charge pump 31 receives the output signal C. The inverter 35 inverts the output signal C, and the second charge pump 32 receives the inverted output signal C.

In the present embodiment, the first charge pump 31 generates a first voltage V1 according to the logical high of the output signal C. The first charge pump 31 comprises the first current source 41, a first switch 42, and a first capacitor 43. The first current source 41 is utilized for providing a current I1. The first switch 42 coupled to the first current source 41 is turned on or off according to the logical high of the output signal C. The first capacitor 43 coupled to the first switch 42 supplies a first voltage V1 from the charge accumulated from the current I1 received from the first current source 41. According to the configuration in FIG. 1, the first switch 42 is controlled according to the output signal C. In an embodiment, the first capacitor 43 is charged within a predetermined number of cycles PC and the first voltage V1 is accumulated; the stored charge is then used to generate the first voltage V1.

The second charge pump 32 generates a second voltage V2 according to the logical low of the output signal C. The second charge pump 32 comprises the second current source 51, a second switch 52, and a second capacitor 53. The second current source 51 is utilized for providing a current I2. The first switch 52 coupled to the second current source 51 is turned on or off according to the logical low of the output signal C due to the presence of an inverter 35. The second capacitor 53 coupled to the second switch 52 supplies a second voltage V2 from the charge accumulated from the current received from the second switch 42. According to the configuration in FIG. 1, the second switch 52 is turned on or off according to the logical low of the output signal C. In an embodiment, the second capacitor 53 is charged within the predetermined number of cycles PC and the second voltage V2 is accumulated; the stored charge is then used to generate the second voltage V2.

In an embodiment, the first charge pump 31 and second charge pump 32 are coupled to the first current source 41. By using only one current source for both charge pumps, errors resulting from differences between the first current source 41 and the second current source 51 can be avoided.

Figure 3:
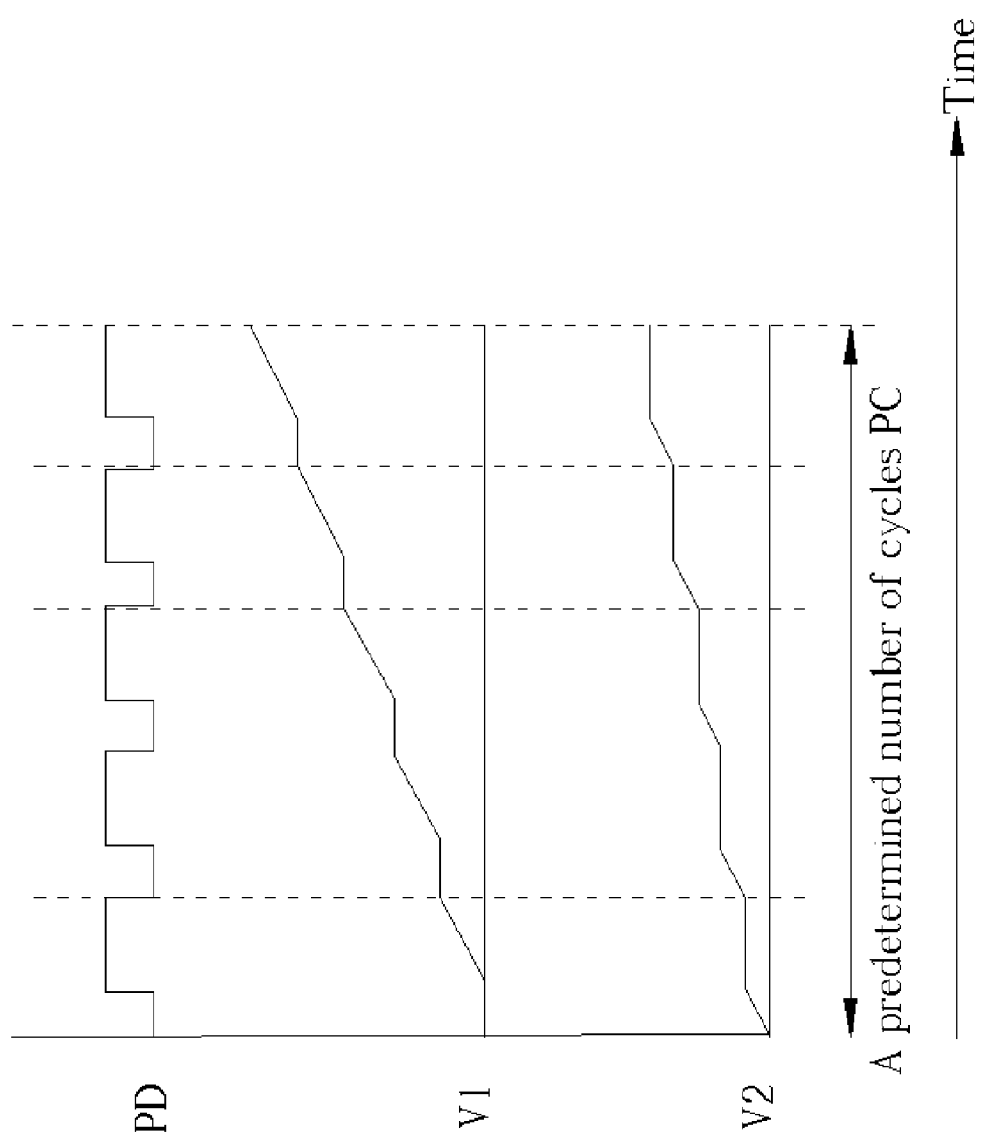
FIG. 3 is a timing diagram showing the output signal C, the first voltage V1, and the second voltage V2 during a predetermined number of cycles PC.

Please refer to FIG. 3. FIG. 3 is a timing diagram showing the output signal C, the first voltage V1, and the second voltage V2 during the predetermined number of cycles PC. It can be clearly shown in FIG. 3 that the larger the number of the predetermined number of cycles PC, the bigger the difference between the first voltage V1 and the second voltage V2. In other words, the difference between the two voltages are exaggerated with the passage of more charging cycles. Therefore the duration of the predetermined number of cycles PC is determined by the needed precision required from the present invention. The bigger the predetermined number of the predetermined number of cycles PC, the more obvious the difference between the first voltage V1 and the second voltage V2, which represents the phase difference, and the higher the precision of the detected phase difference.

Please refer to FIG. 1 again. The first voltage V1 and the second voltage V2 received by the input ends of the comparing circuit 22 in FIG. 1 are compared in order to produce information regarding the phase difference between the first input signal A and the second input signal B. The information regarding the phase difference is then output by the output end of the comparing circuit 22. In an embodiment, the comparing circuit 22 can be implemented using a one-bit comparator. The apparatus of the present invention can know the phase difference according to the output signal from the one-bit comparator and the predetermined number of cycles PC. The output signal of the one-bit comparator can represent that the first input signal A leads or lags the second input signal B. In the other embodiment, the comparing circuit 22 can also be implemented using an analog to digital converter (ADC). A digital value outputted by the ADC can represent the phase difference between the first input signal A and the second input signal B.

Figure 4:
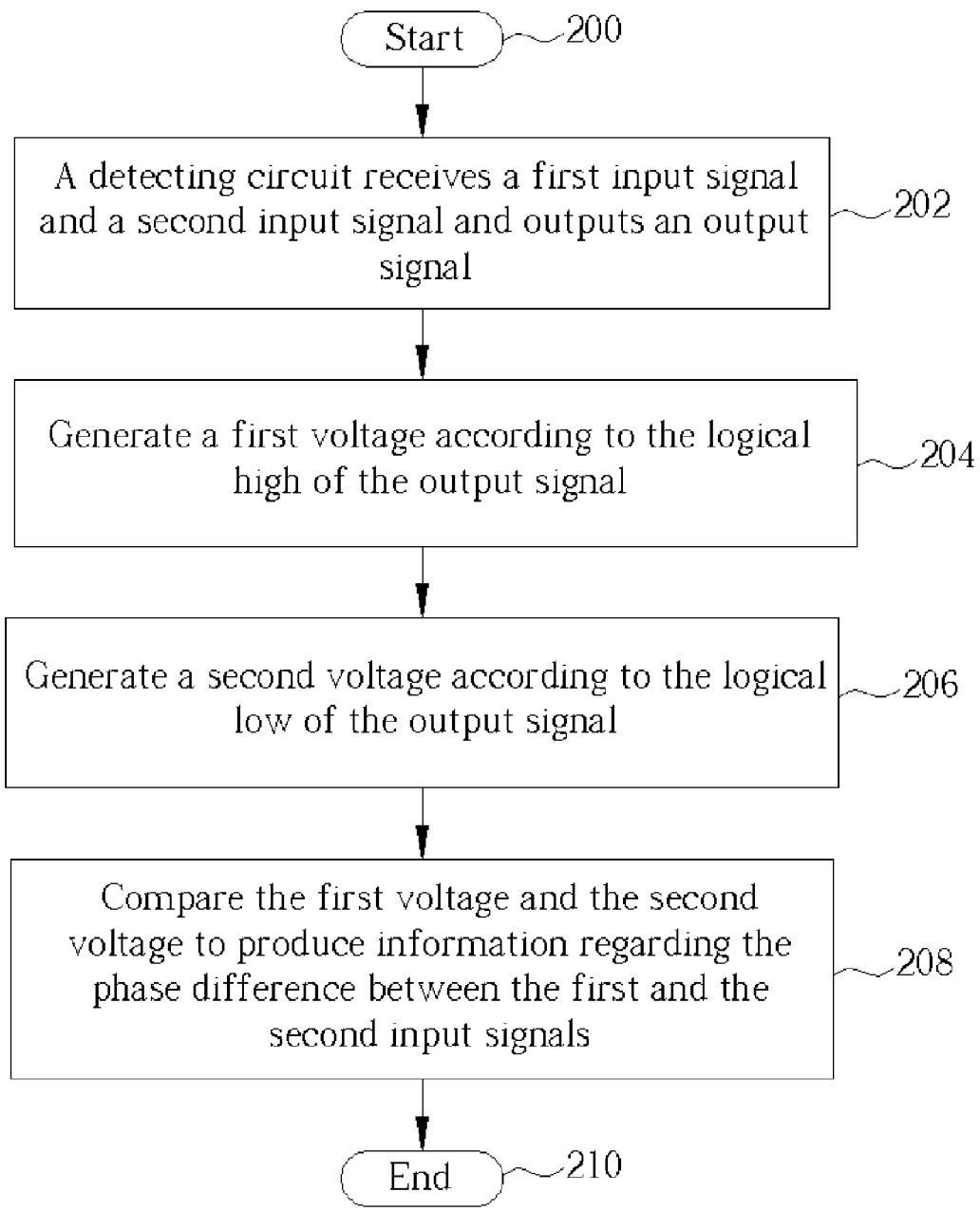
FIG. 4 is a flowchart for detecting a phase difference according to one embodiment of the claimed invention.

FIG. 4 is a flowchart for detecting a phase difference shown in FIG. 1 according to the claimed invention. The flow comprises the following steps:

Step 200: Start;

Step 202: A detecting circuit 20 receives a first input signal A and a second input signal B and produces an output signal C;

Step 204: Generate a first voltage V1 according to the logical high of the output signal C;

Step 206: Generate a second voltage V2 according to the logical low of the output signal C;

Step 208: Compare the first voltage V1 and the second voltage V2 to produce information regarding the phase difference between the first and the second input signals A, B;

Step 210: End.

Ideally, the first charge pump 31 and the second charge pump 32 should function in exactly the same manner, providing the same results for the same signal. In application, however, there may be some discrepancies between the first charge pump 31 and the second charge pump 32 due to process mismatches or other reasons i.e. each pump produce slightly different results when given the same signal. To reduce the above-mentioned effects, in an embodiment, a switch circuit 83 is used to change the coupling relationship between the input signals A, B and the charge pumps 31, 32. By using the above-mentioned switching action and followed by numerical operations on the results of the phase difference detection, the possibly above-mentioned effects can be reduced to the lowest level to get more precise results from the phase difference detection.

Figure 5:
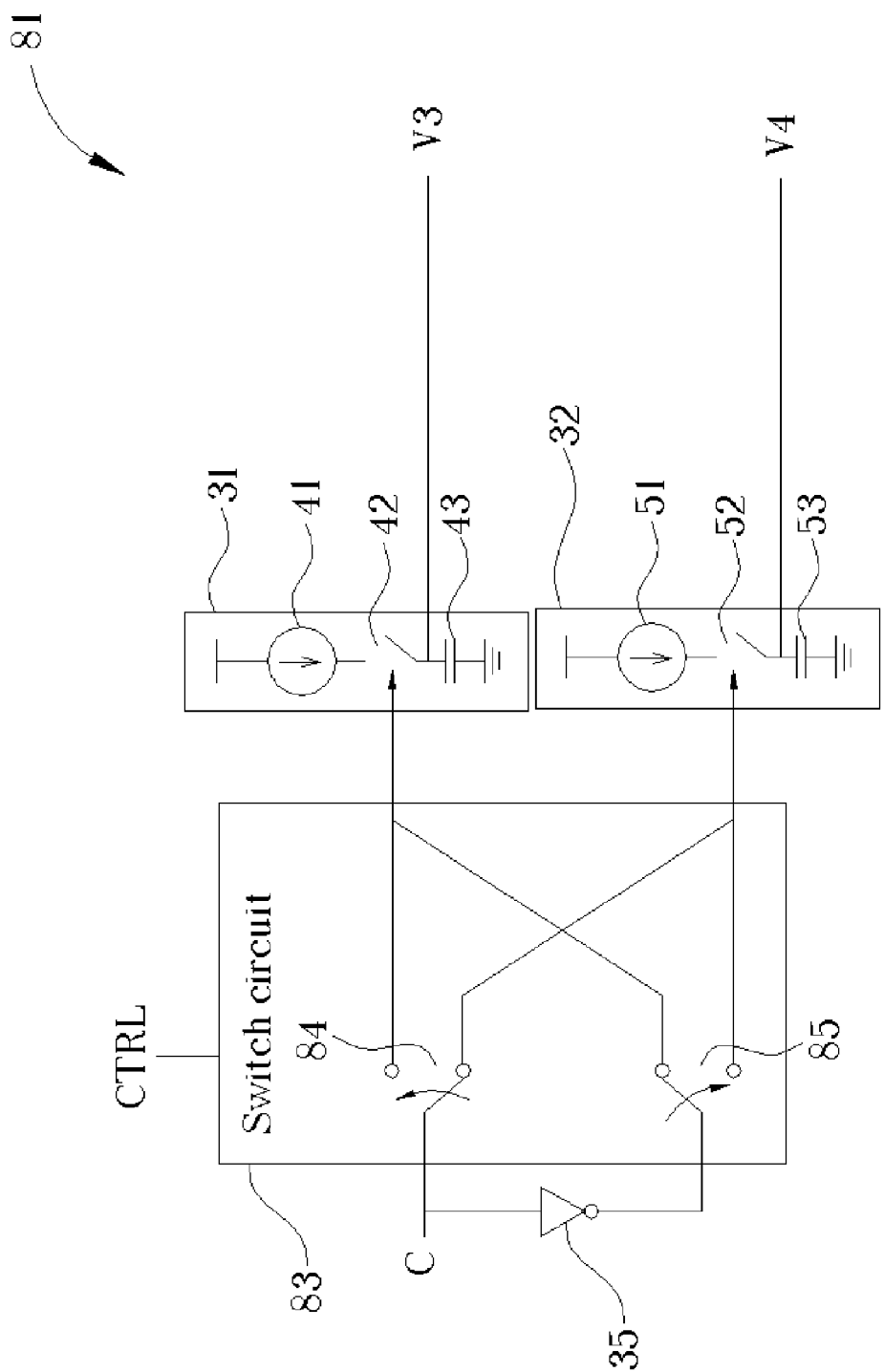
FIG. 5 is a functional diagram of a charge pump module of the embodiment according to the claimed invention.

FIG. 5 is a functional diagram of a charge pump module 81 according to the claimed invention. The charge pump module 81 in FIG. 5 can be utilized for replacing the charge pump module 21 in FIG. 1. The charge pump module 81 comprises a first charge pump 31, a second charge pump 32 and a switch circuit 83. The switch circuit 83 contains two input ends, two output ends, a third switch 84 and a fourth switch 85. The third switch 84 and the fourth switch 85 are controlled by a control signal CTRL. The switch circuit 83 is coupled between the output signal C, the inverted output signal C, the first charge pump 31 and the second charge pump 32. After a predetermined period, the switch circuit 83 is utilized for changing the coupling relationship between the output signals (output signal C, the inverted output signal C) and the charge pumps (first charge pump 31 and the second charge pump 32) using the control signal CTRL.

For example, firstly, the first charge pump 31 will charge the first capacitor 43 according to the logical high of the output signal C and generate a first voltage V1 (same as the V1 in FIG. 1). The second charge pump 32 will charge the second capacitor 53 according to the logical low of the output signal C and generate a second voltage V2 (same as the V2 in FIG. 1). Then the comparing circuit 22 compares the first voltage V1 and the second voltage V2 to produce first information. The switching action occurs after the predetermined number of cycles PC, the first charge pump 31 will charge the first capacitor 43 according to the logical low of the output signal C and generate a third voltage V3. The second charge pump 32 will charge the second capacitor 53 according to the logical high of the output signal C and generate a fourth voltage V4. Then the comparing circuit 22 compares the third voltages V3 and the fourth voltages V4 is to produce second information regarding the phase difference between the first input signal A and the second input signal B. Therefore, by combining the first information regarding the phase difference corresponding to the first voltage V1 and the second voltage V2 and the second information regarding the phase difference corresponding to the third voltage V3 and the fourth voltage V4, more precise phase difference is obtained.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for detecting a phase difference between a first input signal and a second input signal, comprising:
receiving the first and the second input signals and outputting a phase difference signal of the first and the second input signals;
generating a first voltage according to a first level of the phase difference signal and generating a second voltage according to a second level of the phase difference signal; and
comparing the first voltage and the second voltage after a predetermined number of cycles to produce a comparison value that represents the phase difference between the first and the second input signals.

2. The method of claim 1, further comprising:
performing an XOR operation on the first and the second input signals to thereby output the phase difference signal.

3. The method of claim 1, further comprising:
accumulating the first voltage and accumulating the second voltage for the predetermined number of cycles before comparing the first voltage and the second voltage.

4. The method of claim 1, wherein generating the first and second voltages further comprises:
in a first period, generating the first voltage and the second voltage according to the first and the second levels of the phase difference signal, respectively; and
in a second period, generating the first voltage and the second voltage according to the second and the first levels of the phase difference signal, respectively.

5. The method of claim 1, wherein generating the first and second voltages further comprises:
providing first and second currents according to the first and the second levels of the phase difference signal, respectively; and
generating the first and the second voltages according to the first and the second currents.

6. The method of claim 5, wherein generating the first and second voltages further comprises:
providing the first and the second currents according to the second and the first levels of the phase difference signal, respectively.

7. The method of claim 1, wherein a duration of the predetermined number of cycles is greater than a predetermined time duration.

8. The method of claim 1, further comprising:
generating the first voltage according to the first level of the phase difference signal for a first portion of the predetermined number of cycles, and according to the second level of the phase difference signal for a remaining portion of the predetermined number of cycles; and
generating the second voltage according to the second level of the phase difference signal for the first portion of the predetermined number of cycles, and according to the first level of the phase difference signal for a remaining portion of the predetermined number of cycles.

9. An apparatus for detecting a phase difference between a first input signal and a second input signal, comprising:
a detecting circuit utilized for receiving the first and the second input signals to output a phase difference signal of the first and the second input signals;
a charge pump module utilized for respectively generating a first voltage according to a first level of the phase difference signal and generating a second voltage according to a second level of the phase difference signal; and
a comparing circuit utilized for comparing the first voltage and the second voltage after a predetermined number of cycles to produce a comparison signal that represents the phase difference between the first and the second input signals.

10. The apparatus of claim 9, wherein the detecting circuit is an XOR gate.

11. The apparatus of claim 9, wherein the charge pump module is further for accumulating the first voltage and accumulating the second voltage for the predetermined number of cycles before the comparing circuit compares the first voltage and the second voltage.

12. The apparatus of claim 9, wherein the charge pump module comprises a first charge pump for generating the first voltage and a second charge pump for generating the second voltage.

13. The apparatus of claim 12, wherein the first charge pump comprises:
a first current source utilized for providing a first current;
a first capacitor charged by receiving the first current and utilized for generating the first voltage and accumulating the first voltage for the predetermined number of cycles; and
a first switch, coupled between the first current source and the first capacitor, for controlling the charging of the first capacitor according to the first level of the phase difference signal.

14. The apparatus of claim 9, wherein the charge pump module comprises:
a first current source utilized for providing a first current;
a first capacitor charged by receiving the first current, utilized for generating the first voltage and accumulating the first voltage for the predetermined number of cycles;
a first switch, coupled between the first current source and the first capacitor, for controlling the charging of the first capacitor according to the first level of the phase difference signal;
a second capacitor charged by receiving the first current, utilized for generating the second voltage and accumulating the second voltage for the predetermined number of cycles; and
a second switch, coupled between the first current source and the second capacitor, for controlling the charging of the second capacitor according to the second level of the phase difference signal.

15. The apparatus of claim 14, further comprising:
a switch circuit, coupled between the detecting circuit and the charge pump module, for in a first period, coupling the phase difference signal to the first switch and coupling an inverted version of the phase difference signal to the second switch; and
in a second period, coupling the inverted version of the phase difference signal to the first switch and coupling the phase difference signal to the second switch.

16. The apparatus of claim 9, wherein the comparing circuit is a one-bit comparator, the comparison signal output by the one-bit comparator having a one-bit value representing whether the first input signal leads or lags the second input signal.

17. The apparatus of claim 9, wherein the comparing circuit includes an analog to digital converter (ADC) for outputting a digital comparison signal representing the phase difference between the first input signal and the second input signal.

18. The apparatus of claim 9, wherein a duration of the predetermined number of cycles is greater than a predetermined time duration.

19. The apparatus of claim 9, wherein the charge pump module is further for generating the first voltage according to the first level of the phase difference signal for a first portion of the predetermined number of cycles, and according to the second level of the phase difference signal for a remaining portion of the predetermined number of cycles; and for generating the second voltage according to the second level of the phase difference signal for the first portion of the predetermined number of cycles, and according to the first level of the phase difference signal for a remaining portion of the predetermined number of cycles.

20. The apparatus of claim 12, wherein the first charge pump and the second charge pump are substantially the same.

* * * * *